United States Patent [19]

Chai et al.

[11] Patent Number: 4,481,069

[45] Date of Patent: * Nov. 6, 1984

[54] HYDROTHERMAL CRYSTAL GROWING PROCESS

[75] Inventors: Bruce H. Chai, Bridgewater; Ernest Buehler, Chatham; John J. Flynn, Millington, all of N.J.

[73] Assignee: Allied Corporation, Morristown, N.J.

[*] Notice: The portion of the term of this patent subsequent to May 10, 2000 has been disclaimed.

[21] Appl. No.: 337,231

[22] Filed: Jan. 6, 1982

Related U.S. Application Data

[63] Continuation-in-part of Ser. No. 230,075, Jan. 30, 1981, Pat. No. 4,382,840.

[51] Int. Cl.$^3$ ............................................. C30B 7/10
[52] U.S. Cl. ........................ 156/623 R; 156/DIG. 61; 156/DIG. 70
[58] Field of Search .................. 156/623 R, DIG. 61, 156/DIG. 70

[56] References Cited

U.S. PATENT DOCUMENTS

| | | | |
|---|---|---|---|
| 2,675,303 | 4/1954 | Sobek et al. | 156/623 Q |
| 4,247,358 | 1/1981 | Auloin et al. | 156/623 R |
| 4,300,979 | 11/1981 | Kolb et al. | 156/623 R |
| 4,382,840 | 5/1983 | Chai et al. | 156/623 R |

OTHER PUBLICATIONS

Jl. of Crystal Growth, 51, (1981), 178–182, Kolb et al.

Primary Examiner—Hiram H. Bernstein
Attorney, Agent, or Firm—James Riesenfeld; Gerhard Fuchs

[57] ABSTRACT

Large single crystals of berlinite are grown onto seed crystals by maintaining the crystals at a fixed elevated temperature in a pressure vessel containing a nutrient of coarse berlinite crystalline powder, held at a fixed lower temperature, and a mixture of hydrochloric and phosphoric acids. Because berlinite shows retrograde solubility in the acid mixture, the nutrient goes into solution, and berlinite deposits on the higher-temperature growing crystal. Large single crystals of alpha-gallium orthophosphate may be grown using the same apparatus and a similar process. The resultant crystals may be cut into wafers useful in surface acoustic wave devices.

25 Claims, 3 Drawing Figures

4,481,069

HYDROTHERMAL CRYSTAL GROWING PROCESS

DESCRIPTION

This application is a continuation-in-part of application Ser. No. 230,075, filed Jan. 30, 1981, now U.S. Pat. No. 4,382,840, issued May 10, 1983.

BACKGROUND OF THE INVENTION

1. Field of the Invention

This invention relates to a process for growing single crystals of alpha-aluminum orthophosphate and alpha-gallium orthophosphate.

2. Description of the Prior Art

Alpha-aluminum orthophosphate (berlinite) and alpha-gallium orthophosphate ($GaPO_4$) are among several alpha-quartz isomorphs that have for decades been synthesized for research purposes. An attempt to grow large single crystals of berlinite began after World War II, in an effort to find new piezoelectric crystals for frequency control applications. The project ended a few years later, because success was achieved in quartz crystal growth and because quartz was considered superior for the piezoelectric devices known then. Specifically, it was concluded that berlinite had a lower Q and lower coupling coefficient than quartz. Furthermore, tests on both X and Y cuts to berlinite plates, showing a negative frequency drift with increasing temperature, indicated that there was little chance of finding a zero temperature cut similar to the AT cut of quartz.

Interest in berlinite was renewed in 1976, when Barsch and Chang found that berlinite does have temperature-compensated cuts and that the coupling coefficient for surface acoustic wave (SAW) devices can be four times greater than for quartz.

Several processes for preparing berlinite have been reported in the technical (W. Jahn et al., Chem. Erde 16, 75 (1953); J. M. Stanley, Ind. Eng. Chem. 46, 1684 (1954); E. D. Kolb et al., J. Crystal Growth 43, 313 (1978)); and L. E. Drafall et al., RADC-TR-80-73, Final Technical Report, March, 1980.

In a typical process, seed crystals are suspended near the bottom of a vertical autoclave and nutrient powder is suspended in a basket at the top. Both seed and nutrient are immersed in concentrated phosphoric acid. In one variation of the process, the temperature is raised slowly from about 150° C. over a period of days. In another variation, a temperature gradient is maintained in the autoclave. In some cases, a gradient is maintained as the temperature is slowly raised.

Although most of the processes reported involve growth in phosphoric acid, two recent reports on growth in hydrochloric acid have appeared. Detaint et al., Proc. 34th Symp. on Freq. Control, p. 93 (1980), grew berlinite crystals from powder by increasing the temperature 4° C. per day during hydrothermal growth in HCl. Kolb et al., J. Crystal Growth 51, 178 (1981), achieved higher growth rates in HCl at comparable conditions to those used for $H_3PO_4$ growth. In their method, a temperature gradient of about 1°–3° C. was maintained as the temperature was increased from about 150° C. to about 200° C. or higher at 2°–20° C./day.

None of the prior art methods for growing berlinite consistently provide crystals having the high degree of quality—i.e., freedom from defects—needed for SAW device applications.

SUMMARY OF THE INVENTION

In accordance with the present invention, a process is provided for growing crystals of alpha-aluminum orthophosphate or alpha-gallium orthophosphate.

The process comprises the steps of (a) suspending a seed crystal of the metal orthophosphate in a first chamber of a pressure vessel, said first chamber being partitioned from at least one additional chamber with a baffle, through which fluid may flow, (b) introducing into a second chamber of the vessel a quantity of nutrient crystals of the metal orthophosphate, (c) partially filling the vessel with a mixture of hydrochloric acid and phosphoric acid, (d) sealing the vessel, (e) heating the contents of the vessel to achieve a seed crystal temperature in the range of about 135° C. to 210° C. and a nutrient temperature about 5° C. to 30° C. lower, (f) maintaining the temperatures in the vessel whereby the seed crystal grows from an acid solution of the metal orthophosphate, and (g) recovering the crystal product.

Among the advantages of the present process are high yield of high quality crystals, low cost, reproducible results, and scale-up capability. The single crystals that result find applications in SAW devices.

DETAILED DESCRIPTION OF THE INVENTION

Figure 1:
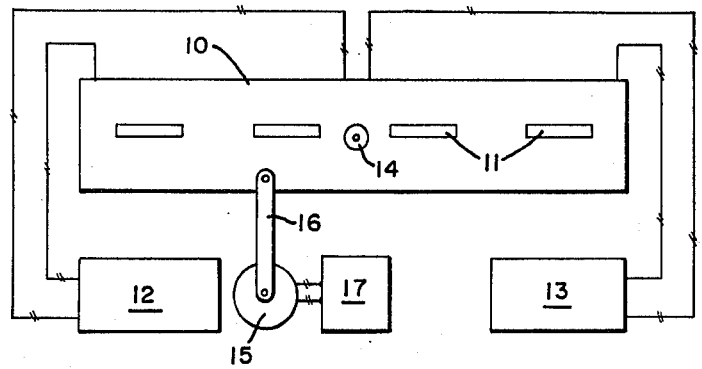
FIG. 1 is a schematic of an apparatus suitable for practicing the process of the present invention.

This invention provides a process for preparing single crystals of isomorphs of alpha-quartz, such as berlinite and $GaPO_4$. For convenience, the procedure for growing berlinite crystals is described below; except where noted, the preparation of $GaPO_4$ crystals is identical.

A suitable apparatus comprises a substantially cylindrical pressure vessel for containing the materials of the process and means for heating the vessel and maintaining it at a predetermined temperature gradient. The apparatus is described below in some detail, although the process of this invention may be practiced with other apparatuses. Additional detail appears in U.S. Pat. No. 4,382,840, issued May 10, 1983, and the disclosure of that patent, to the extent not inconsistent herewith, is incorporated herein by reference.

The pressure vessel is adapted for holding a mixture of hydrochloric acid and phosphoric acid, in which is immersed, in one chamber, one or more berlinite seed crystals, and, in one or two adjoining chambers, coarse berlinite crystalline powder (or nutrient). (Of course, when $GaPO_4$ crystals are being grown, the seed and nutrient are of that material.) The vessel walls are preferably transparent to permit observation of the growth process.

For convenience of loading, unloading, and cleaning the vessel, it is preferably a tube, having a demountable seal at each end. Each seal may comprise an elastomer gasket for mounting between a fluoropolymer plug and the tube. The plug and gasket are preferably resistant to the high temperature and pressure and corrosive environment in the vessel. PTFE is a suitable fluoropolymer and Viton ® is a suitable gasket material.

Each chamber of the vessel is separated from the adjoining chamber(s) by a baffle. The baffle serves to maintain a temperature gradient between the chambers, while, at the same time, permitting liquid to flow between the chambers. Thus, the baffle material is desirably thermally insulating and resistant to the corrosive environment and high temperatures in the pressure vessel.

At the start of the process, berlinite seed crystals are suspended in a chamber of the vessel. The seed crystals are prepared by a process known in the art; for example, the process described by Krauss et al. (Z. Naturforschung, 30 A, 28 (1975)). Suitable seed crystals prepared by Krauss's method are single crystals at least 5 mm across. Preferably, a plurality of seed crystals are used, their orientation and positioning chosen to maximize growth rate, minimize crystal defects, and avoid contacting growing crystals with the vessel wall.

The seed crystals are suspended from fluropolymer seed hangers mounted on a frame formed of a corrosion-resistant material. Platinum wire frames, having sufficient springiness to push against the vessel walls for support, have been used satisfactorily.

Preparation of the coarse berlinite powder, or nutrient, that is used in the present process is disclosed in U.S. Pat. No. 4,324,773, issued Apr. 13, 1982. The disclosure of that patent is incorporated herein by reference. The preferred particle size for the nutrient is about 20-60 mesh.

The nutrient is introduced into one or more chambers adjoining that which holds the seed crystals. Preferably, the nutrient is contained in a pervious enclosure that permits liquid flow-through while retaining all but the smallest nutrient particles. It is important that small particles of nutrient do not make their way to a growing crystal and become incorporated in it. Orienting the vessel horizontally reduces that possibility.

Hydrochloric and phosphoric acids are introduced into the vessel in an amount to submerge the nutrient and seed crystals. Initial HCl molarity is preferably in the range between about 1-6 M, more preferably about 3-4 M. Reagent grade HCl is suitable. Electronic grade 85% $H_3PO_4$ is commercially available and suitable. Preferably, the initial $H_3PO_4$ molarity is in the range between about 2-7.5M, with 2-3M preferred (when $GaPO_4$ is being prepared, higher $H_3PO_4$ molarity, about 3-10M, is preferred). The sum of HCl and $H_3PO_4$ molarities is preferred about 6-7 (about 8 when $GaPO_4$ is being prepared), with HCl molarity slightly higher. A mixture of 4M HCl and 2M $H_3PO_4$ yielded the best results. As much acid as possible is introduced into the vessel to maximize the yield; however, if more than 85 percent of the vessel is filled at ambient temperature, then the entire vessel will be filled at about 210° and excessive pressure may develop. Thus, filling the vessel beyond 85% is not recommended.

The heating means may be any of several known in the art. A cylindrical furnace having two independently-controlled resistance heating zones is suitable for achieving the elevated temperature and temperature gradient in the vessel. The temperatures are measured exterior to the vessel, for example using thermocouples, and provide an adequate approximation to the interior temperatures. Temperatures are controlled at the centers of the chambers and may vary by about ±3° C. within each chamber. Conventional controllers capable of maintaining control temperatures within about ±1° C. of the desired temperatures may be used. If the vessel has three chambers, a three-zone furnace is necessary. The vessel is heated to achieve a seed crystal temperature in the range from about 135° C. to 210° C., with about 170° C. preferred. (A higher temperature range, about 170°-210° C., is preferred for $GaPO_4$ crystal growth, with about 185° C. most preferred). A gradient is established, so that the nutrient is at a temperature about 5° C. to 30° C. lower than that of the seed crystals, preferably about 10° C. lower. The nutrient should remain above 130° C., where berinite undergoes a phase change and the solution chemistry is changed. If the temperature of a growing crystal is too high, excessive nucleation takes place. If the temperature gradient is too large, excessive nucleation also takes place, and, furthermore the solution boils in the region of the growing crystals. If the temperature is too low, growth is very slow.

With the seed crystals and nutrient immersed in the hydrochloric-phosphoric acid mixture and the elevated temperature and temperature gradient established, the seed crystals begin to grow. Although we do not wish to be bound to a particular theory, we believe the growth mechanism is as follows Berlinite shows retrograde solubility in both acids; however, the mechanisms are totally different. When berlinite dissolves in phosphoric acid, it polymerizes into long chain molecules, which are undesirable for crystal growth. The degree of polymerization is temperature dependent and decreases with increasing temperature. This gives the apparent retrograde solubility. When berlinite dissolves in hydrochloric acid, instead of polymerizing, the aluminum ion complexes strongly with the chloride ion. The complexing is also temperature dependent and decreases with increasing temperature, again yielding apparent retrograde solubility.

When berlinite dissolves in a mixture of phosphoric acid and hydrochloric acid, the two acids compete for the available aluminum phosphate molecules. By properly balancing the strength of each acid, we control the species of nutrient in the solution. At the higher temperature of the seed crystals, the solution is supersaturated in berlinite. The berlinite comes out of solution and deposits on the seed crystals, causing them to grow. As the process continues, there is a continual depletion of nutrient in the second chamber and a corresponding growth on the seed crystals.

To enhance the flow of berlinite-enriched solution toward the seed crystal and depleted solution toward the nutrient, the vessel is preferably oriented horizontally and fluid in the vessel is continually flowed between the chambers. This is conveniently accomplished by rocking the vessel about a horizontal axis normal to its cylinder axis. The rocking action is accomplished by methods well known in the art, such as a motor drive. Each end of the vessel may be raised and lowered at regular intervals of about 6 to about 1800 seconds, with the preferred interval range being about 10 to 30 seconds. As the vessel is rocked, preferably the nutrient and growing crystals remain submerged. This goal is achieved by using the maximum feasible fill, as discussed above; by not mounting seed crystals or positioning nutrient near the top and ends of the vessel; and by limiting the rocking so that the raised end of the vessel preferably makes with the horizontal an angle of less than 45°, more preferably less than 10°.

By the mechanism described above, and at a rate enhanced by the rocking motion, the berlinite seed crystals grow in the solution when the temperature and temperature gradient are within the appropriate range. After about two weeks, the crystal attains a usable size; however, larger crystals are preferred, requiring a growth period of at least about a month. Growth is stopped when the crystals reach the desired size, or before that if the crystals are coming into contact with the walls or if the nutrient is nearly depleted. Growth should not continue until the nutrient is depleted, since then the crystals go into solution.

Because of berlinite's retrograde solubility, there is a tendency for the crystals to go into solution as the vessel is cooled after growth is complete. Consequently, the vessel is cooled rapidly, for example by spraying the vessel with water, until the pressure is reduced to a value at which the vessel may be opened safely. Generally, the vessel may be opened after the temperature is below 100° C.; however, for convenience, the temperature may be further reduced to near ambient temperature. A water spray accomplishes cooling in about 10–15 minutes, after which the crystals can be removed from the solution. If more rapid cooling is attempted, there is a danger that the crystals might crack. After recovering them from the solution, crystals grown by the present process are cut into wafers for SAW devices, using conventional slicing machines.

An alternative method for recovering the crystals after growth is complete involves a second (or syringe) vessel. The syringe vessel includes means for pumping solution into and out of the pressure vessel, for example a piston mounted in the syringe vessel and one or more high-pressure, corrosion-resistant valves to control flow between the vessels. In a preferred embodiment when crystal growth is complete, the syringe vessel is joined to the pressure vessel and hot solution is transferred to the syringe vessel. Thereafter, the crystals in the pressure vessel may be cooled slowly to avoid cracking, since they can no longer go into solution. If two valves are used between the vessels, then one syringe vessel can serve several pressure vessels. The syringe vessel can also be used to prevent dissolution of the seed crystal as the system is warmed at the beginning of the process. The acid is heated in the syringe vessel as the nutrient and seeds are heated in the pressure vessel. When the desired temperatures are achieved, the hot acid is transferred from the syringe vessel to the pressure vessel.

An apparatus suitable for use with the process of the present invention is further described with reference to the Figures. Where an element of the apparatus appears in more than one Figure, it retains the same reference number in each.

FIG. 1 depicts a schematic of an apparatus suitable for the present process. The pressure vessel is enclosed in a steel jacket, surrounded by a furnace 10. The progress of the crystal growing can be observed through windows 11. Temperatures in the two chambers of the vessel are controlled by temperature controllers 12 and 13. Tthe apparatus is rocked about an axis 14 by motor 15, joined to the vessel through arm 16. Motor speed may be controlled by controller 17.

Figure 2:
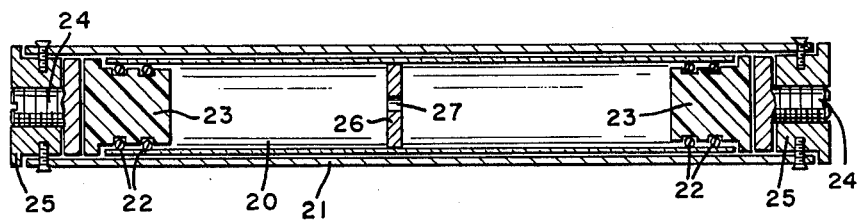
FIG. 2 is a sectional view of a pressure vessel and jacket of a suitable apparatus.

FIG. 2 shows a pressure vessel and jacket of a suitable apparatus in cross section. Pressure vessel 20 is a transparent material, for example fused silica, and jacket 21 may be of steel. Pressure vessel 20 is sealed at its ends by elastomer O-rings 22 and fluoropolymer plugs 23. The plugs 23 are held in place by threaded end caps 24 of jacket plugs 25. The two chambers of the pressure vessel are separated by baffle 26, having through-hole 27.

Figure 3:
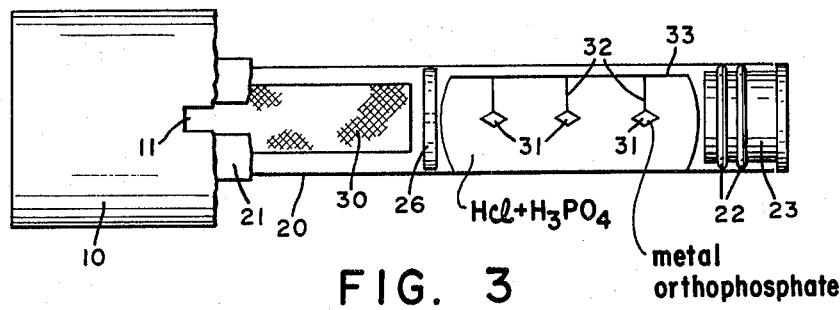
FIG. 3 is a partially cut-away side view of a fully-loaded apparatus.

FIG. 3 shows a cut-away side view of the apparatus loaded with nutrient, in nutrient bag 30, and with seed crystals 31 both immersed in a mixture of hydrochloric and phosphoric acids. Seed crystals 31 are supported from hangers 32, which, in turn, are suspended from frame 33.

The following examples are presented in order to provide a more complete understanding of the invention. The specific techniques, conditions, materials, and reported data set forth to illustrate the principles and practice of the invention are exemplary and should not be construed as limiting the scope of the invention.

EXAMPLE 1

Since crystals of berlinite were grown in a horizontally-oriented, fused silica pressure vessel, 1 m long × 3 cm ID. A PTFE baffle divided the vessel into two communicating chambers. One chamber was loaded with 16 berlinite seed crystals, 5 X-plates 11 and Y-plates, and the other chamber with coarse berlinite crystalline powder (20–50 mesh). After adding 7.3M $H_3PO_4$ and 1M HCl to the vessel, the starting materials occupied nearly 85% of the vessel volume. The vessel was then sealed. The chamber holding the seed crystals was heated to 168° C. (in the center of the chamber) and the chamber holding the nutrient to 154° C. (in the center). The temperatures were maintained and the vessel rocked with a period of 10 s/cycle. At the extremes of the rocking, the long dimension of the vessel made an angle of 5° with the horizontal. After 42 days, a water spray cooled the vessel to near ambient temperature in less than 15 minutes, and the crystals were recovered from the solution. Originally about 1 mm thick, the crystals had grown at a rate of 0.107 mm/side/day on the X-plates and 0.102 mm/side/day on the Y-plates. Heavy nucleation had formed on the vessel walls and had badly damaged the crystal surfaces.

EXAMPLE 2 (Prior Art)

The apparatus and process of EXAMPLE 1 were used, except that the starting solution was 3M HCl, the seed crystal temperature 169° C., nutrient temperature 148° C., and growth time 29 days. Growth rates (mm/side/day) were: basal: 0.141; X-plate: 0.043; Y-plate: 0.015; (1011 plate: 0.023. There was some nucleation at the top of the vessel and crystal quality were poor.

EXAMPLE 3

The apparatus and process of EXAMPLE 1 were used, except that the starting solution was a mixture of 3.7M $H_3PO_4$ and 3M HCl, seed crystal temperature 170° C., nutrient temperature 152° C., and growth time 43 days. Twenty-five basal plates grew at an average rate of 0.227 mm/side/day. Heavy, uniform nucleation took place at the bottom of the vessel. Crystals showed crevices and channels, which would impair their performance in a SAW device.

EXAMPLE 4

The apparatus and process of EXAMPLE 1 were used, except that the starting solution was a mixture of 2M $H_3PO_4$ and 4M HCl, seed crystal temperature 170° C., nutrient temperature 154° C., and growth time 28 days. Twenty-five basal plates grew at an average rate of 0.322 mm/side/day. Moderately heavy, uniform nucleation took place at the bottom of the vessel. Crystal quality was excellent.

EXAMPLE 5

The apparatus and process of EXAMPLE 1 were used, except that the starting solution was a mixture of 2M $H_3PO_4$ and 4M HCl, seed crystal temperature was 170° C., nutrient temperature 160° C., and growth time 35 days. Twenty-eight basal plates grew at an average rate of 0.194 mm/side/day. Very light nucleation took place at the bottom of the vessel. Crystal quality was excellent.

We claim:

1. A process for growing crystals of a metal orthophosphate selected from the group consisting of alpha-aluminum orthophosphate and alpha-gallium orthophosphate, comprising the steps of:
   (a) suspending a seed crystal of the metal orthophosphate in a first chamber of a substantially horizontally-oriented pressure vessel, and first chamber being partitioned from at least one additional chamber so that a temperature gradient can be maintained and fluid can flow between the chambers,
   (b) introducing into a second chamber of the vessel a quantity of nutrient crystals of the metal orthophosphate, and then, sequentially,
   (c) partially filling the vessel with a mixture of hydrochloric acid and phosphoric acid,
   (d) sealing the vessel,
   (e) heating the contents of the vessel to achieve a seed crystal temperature in the range from about 135° C. to 210° C. and a nutrient temperature from about 5° C. to 30° C. lower,
   (f) maintaining the temperatures in the vessel while rocking the vessel about a horizontal axis to raise first one chamber of the vessel and then another, whereby the seed crystal grows from an acid solution of the metal orthophosphate, and
   (g) recovering the crystal product.

2. The process of claim 1 in which the metal orthophosphate is aluminum-orthophosphate.

3. The process of claim 2 in which the hydrochloric acid molarity is in the range from about 1 to about 6M.

4. The process of claim 3 in which the hydrochloric acid molarity is about 3 to about 4M.

5. The process of claim 2 in which the phosphoric acid molarity is in the range from about 2 to about 7.5M.

6. The process of claim 5 in which the phosphoric acid molarity is in the range from about 2 to about 3M.

7. The process of claim 4 in which the sum of hydrochloric and phosphoric acid molarities is about 6 to about 7M.

8. The process of claim 4 in which the vessel is heated to provide a seed crystal temperature of about 170° C.

9. The process of claim 1 in which the metal orthophosphate is gallium-orthophosphate.

10. The process of claim 9 in which the hydrochloric acid molarity is in the range from about 1 to about 6M.

11. The process of claim 10 in which the phosphoric acid molarity is in the range from about 3 to about 10M.

12. The process of claim 10 in which the sum of hydrochloric acid and phosphoric acid molarities is about 8M.

13. The process of claim 10 in which the vessel is heated to provide a seed crystal temperature of about 185° C.

14. The process of claim 1 in which a nutrient temperature about 10° C. lower than that of the seed crystal is maintained.

15. The process of claim 1 in which a plurality of seed crystals are suspended in the first chamber.

16. The process of claim 1 in which the nutrient crystal size is about 20–60 mesh.

17. The process of claim 1 in which the nutrient is contained in a pervious enclosure.

18. The process of claim 1 in which the quantity of acid, nutrient, and seed crystal are chosen so that they fill less than about 85 percent of the volume of the vessel.

19. The process of claim 1 in which the fluid is flowed between the chambers by raising and lowering an end of the vessel at regular intervals of about 6 to about 1800 seconds.

20. The process of claim 19 in which the regular intervals are about 10 to about 30 seconds.

21. The process of claim 19 in which the angle that the raised end of the vessel makes with the horizontal is less than about 45°.

22. The process of claim 21 in which the angle that the raised end of the vessel makes with the horizontal is less than about 10°.

23. The process of claim 1 in which the vessel is cooled to a temperature below about 100° C. in less than about 15 minutes before the crystal product is recovered.

24. The process of claim 1 further comprising the step of removing the solution before the crystal product is recovered.

25. A process for growing crystals of a metal orthophosphate selected from the group consisting of alpha-aluminum orthophosphate and alpha-gallium orthophosphate, comprising the steps of:
   (a) suspending a seed crystal of the metal orthophosphate in a first chamber of a substantially horizontally-oriented pressure vessel, said first chamber being partitioned from at least one additional chamber so that a temperature gradient can be maintained and fluid can flow between the chambers,
   (b) introducing into a second chamber of the vessel a quantity of nutrient crystals of the metal orthophosphate, and then, sequentially,
   (c) sealing the vessel,
   (d) heating the contents of the vessel to achieve a seed crystal temperature in the range from about 135° C. to 210° C. and a nutrient temperature of about 5° C. to 30° C. lower,
   (e) partially filling the vessel with a mixture of hydrochloric acid and phosphoric acid,
   (f) maintaining the temperatures in the vessel while rocking the vessel about a horizontal axis to raise first one chamber of the vessel and then another, whereby the seed crystal grows from an acid solution of the metal orthophosphate, and
   (g) recovering the crystal product.

* * * * *

UNITED STATES PATENT AND TRADEMARK OFFICE
CERTIFICATE OF CORRECTION

PATENT NO. : 4,481,069
DATED : November 6, 1984
INVENTOR(S) : B. H. Chai, E. Buehler, J. J. Flynn It is certified that error appears in the above-identified patent and that said Letters Patent are hereby corrected as shown below:

Claim 1, line 7, "and" should read --said--

Signed and Sealed this

Thirtieth Day of April 1985

[SEAL]

Attest:

DONALD J. QUIGG

Attesting Officer  Acting Commissioner of Patents and Trademarks